(12) United States Patent
Gandikota et al.

(10) Patent No.: US 12,051,734 B2
(45) Date of Patent: Jul. 30, 2024

(54) PMOS HIGH-K METAL GATES

(71) Applicant: Applied Materials, Inc., Santa Clara, CA (US)

(72) Inventors: Srinivas Gandikota, Santa Clara, CA (US); Steven C. H. Hung, Sunnyvale, CA (US); Mandyam Sriram, San Jose, CA (US); Jacqueline S. Wrench, San Jose, CA (US); Yixiong Yang, Fremont, CA (US); Yong Yang, Boston, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/076,958

(22) Filed: Dec. 7, 2022

(65) Prior Publication Data

US 2023/0097400 A1    Mar. 30, 2023

Related U.S. Application Data

(62) Division of application No. 17/013,161, filed on Sep. 4, 2020, now Pat. No. 11,552,177.

(51) Int. Cl.
*H01L 29/40* (2006.01)
*H01L 29/49* (2006.01)
(Continued)

(52) U.S. Cl.
CPC ........ *H01L 29/4966* (2013.01); *H01L 29/401* (2013.01); *H01L 29/517* (2013.01);
(Continued)

(58) Field of Classification Search
CPC ........... H01L 21/76811; H01L 29/4966; H01L 29/401; H01L 29/517; H01L 21/28088;
(Continued)

(56) References Cited

U.S. PATENT DOCUMENTS 7,473,640 B2    1/2009  Conley, Jr. et al.
8,987,080 B2 *  3/2015  Lu ..................... H01L 21/3221
                                                  438/587

(Continued)

FOREIGN PATENT DOCUMENTS

CN    106992118 A  *  7/2017  ............. C23C 14/58
KR      100831974 B1      5/2008
KR    1020090031103 A     3/2009

OTHER PUBLICATIONS

Machine Translation of KR100831974, 8 pages, May 26, 2008.
(Continued)

*Primary Examiner* — Mohammad M Choudhry
(74) *Attorney, Agent, or Firm* — SERVILLA WHITNEY LLC

(57) ABSTRACT

Metal gate stacks and integrated methods of forming metal gate stacks are disclosed. Some embodiments comprise NbN as a PMOS work function material at a thickness in a range of greater than or equal to 5 Å to less than or equal to 50 Å. The PMOS work function material comprising NbN has an effective work function of greater than or equal to 4.75 eV. Some embodiments comprise $HfO_2$ as a high-κ metal oxide layer. Some embodiments provide improved PMOS band-edge performance evidenced by improved flatband voltage. Some embodiments exclude transition metal niobium nitride materials as work function materials.

13 Claims, 3 Drawing Sheets

(51) Int. Cl.
  *H01L 29/51* (2006.01)
  *H01L 21/28* (2006.01)
  *H01L 21/285* (2006.01)
(52) U.S. Cl.
  CPC .. *H01L 21/28088* (2013.01); *H01L 21/28194* (2013.01); *H01L 21/28568* (2013.01); *H01L 29/518* (2013.01)
(58) Field of Classification Search
  CPC ......... H01L 21/28194; H01L 21/28568; H01L 29/518
  See application file for complete search history.

(56) References Cited

U.S. PATENT DOCUMENTS

| | | |
|---|---|---|
| 9,082,702 B2 | 7/2015 | Lei et al. |
| 9,991,382 B1 | 6/2018 | Mochizuki et al. |
| 10,643,904 B2 | 5/2020 | Xie et al. |
| 2004/0023478 A1* | 2/2004 | Samavedam ... H01L 21/823864 257/E21.64 |
| 2004/0164362 A1 | 8/2004 | Conley, Jr. et al. |
| 2006/0153995 A1 | 7/2006 | Narwankar et al. |
| 2008/0042173 A1 | 2/2008 | Nam et al. |
| 2016/0351569 A1* | 12/2016 | Song .................. H01L 29/4966 |
| 2018/0122709 A1 | 5/2018 | Xie et al. |
| 2018/0158688 A1 | 6/2018 | Chen |
| 2019/0341317 A1 | 11/2019 | Huang et al. |
| 2019/0393097 A1* | 12/2019 | Tapily ................ H01L 29/4908 |
| 2020/0144255 A1 | 5/2020 | Lee et al. |
| 2020/0273700 A1* | 8/2020 | Cheng .............. H01L 21/02181 |

OTHER PUBLICATIONS

Machine Translation of KR20090031103, 12 pages, Mar. 25, 2009.
PCT International Search Report and Written Opinion in PCT/US2021/048586 dated Dec. 21, 2021, 12 pages.
Schaeffer, J. K., et al., "Application of group electronegativity concepts to the effective work functions of metal gate electrodes on high-k gate oxides", Microelectronic Engineering 84 (2007), pp. 2196-2200.

* cited by examiner

PMOS HIGH-K METAL GATES

CROSS-REFERENCE TO RELATED APPLICATIONS

This application is a divisional of U.S. patent application Ser. No. 17/013,161, filed Sep. 4, 2020, the entire disclosure of which is hereby incorporated by reference herein.

TECHNICAL FIELD

Embodiments of the present disclosure generally relate to work function materials for PMOS (positive metal-oxide-semiconductor) high-κ metal gate (HKMG) stacks.

BACKGROUND

Integrated circuits have evolved into complex devices that can include millions of transistors, capacitors, and resistors on a single chip. In the course of integrated circuit evolution, functional density (i.e., the number of interconnected devices per chip area) has generally increased while geometry size (i.e., the smallest component (or line) that can be created using a fabrication process) has decreased.

As device dimensions have shrunk, device geometries and materials have experienced difficulty maintaining switching speeds without incurring failures. Several new technologies have emerged that allow chip designers to continue shrinking device dimensions. Control of the dimensions of device structure is a key challenge for present and future technology generations.

Microelectronic devices are fabricated on a semiconductor substrate as integrated circuits in which various conductive layers are interconnected with one another to permit electronic signals to propagate within the device. An example of such a device is a complementary metal-oxide-semiconductor (CMOS) field effect transistor (FET) or MOSFET. A gate electrode is part of an integrated circuit. For example, a MOSFET comprises a gate structure disposed between source and drain regions that are formed in the semiconductor substrate. The gate structure or stack generally comprises a gate electrode and a gate dielectric. The gate electrode is disposed over the gate dielectric to control a flow of charge carriers in a channel region that is formed between drain and source regions beneath the gate dielectric.

Current PMOS high-κ metal gate stacks include TiN as high-κ capping layer followed by TiN as a PMOS work function material. Some new PMOS work function materials advantageously show more PMOS bandedge $V_{fb}$ performance, yet also demonstrate an equivalent oxide thickness (EOT) penalty.

Accordingly, there is a need for materials with more bandedge $V_{fb}$ performance than TiN. Further, there is a need for these devices to have a minimal EOT penalty.

SUMMARY

One or more embodiments of the disclosure are directed to a metal gate stack comprising a positive metal-oxide-semiconductor (PMOS) work function material on a high-κ metal oxide layer and below a gate electrode. The PMOS work function material comprises NbN. The metal gate stack has flatband voltage ($V_{fb}$) improved relative to a metal gate stack comprising a comparative PMOS work function material comprising TiN.

Additional embodiments of the disclosure are directed to a metal gate stack comprising a high-κ metal oxide layer, and a positive metal-oxide-semiconductor (PMOS) work function material above the high-κ metal oxide layer. The PMOS work function material comprises NbN and has a thickness in a range of greater than or equal to 5 Å to less than or equal to 50 Å. The PMOS work function material comprising NbN at the thickness in a range of greater than or equal to 5 Å to less than or equal to 50 Å has an effective work function of greater than or equal to 4.75 eV.

Further embodiments of the disclosure are directed to a method of manufacturing a metal gate stack. The method comprises depositing a high-κ metal oxide layer on a substrate within a first processing chamber. The substrate is transferred to a second processing chamber. A positive metal-oxide-semiconductor (PMOS) work function material comprising NbN is deposited at a thickness in a range of greater than or equal to 5 Å to less than or equal to 50 Å by atomic layer deposition on the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
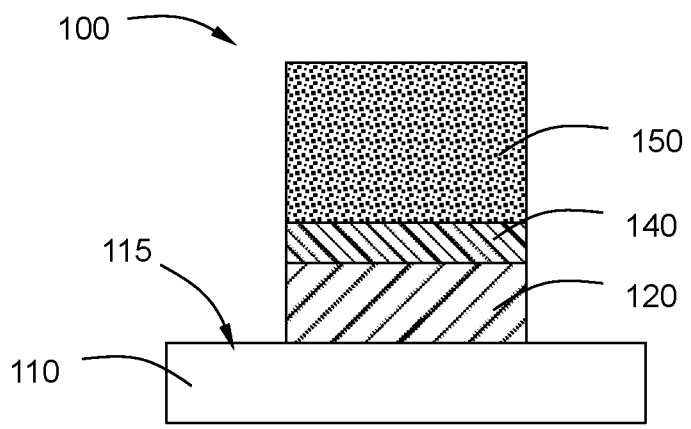
FIG. 1 is a cross-sectional view of a metal gate stack in accordance with one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Embodiments of the present disclosure relate to metal gate stacks with improved bandedge performance, e.g., improved flatband voltage ($V_{fb}$). Some embodiments of this disclosure provide metal gate stacks with a $V_{fb}$ improved relative to comparative metal gate stacks using TiN as a PMOS work function material. In some embodiments, the PMOS work function material comprises NbN. In some embodiments, the PMOS work function material excludes transition metal niobium nitride materials. A layer comprising NbN as a PMOS work function material may also be functional as a high-κ capping layer.

Experiments directed to $V_{fb}$ performance for NbN work function materials shows improvements of $V_{fb}$ of greater than or equal +100 mV, specifically greater than +200 mV and less than or equal to +300 mV. In an experiment, static work function ($V_{fb}$) improvement was +254.5 mV for a NbN-only work function material, relative to a comparative TiN work function material. The work function material was deposited by atomic layer deposition using precursors of $NbCl_5$ and $NH_3$ at 450° C. For the NbN-only work function material, there was not an equivalent oxide thickness (EOT) penalty (−0.3 Å). In the static work function experiments, there was an oxidized surface of $SiO_2$ of a Si substrate, on which there was a high-κ metal oxide layer of $HfO_2$ followed by the work function material, onto which a multi-layered electrode was deposited (TiiAl, TiN by ALD, TiN by PVD).

Experiments directed to intrinsic work function ($V_{fb}$) performance for NbN work function materials over a temperature range of greater than or equal to 300° C. to less than or equal to 500° C. consistently showed improvements of $V_{fb}$ relative to a TiN work function material. The NbN work function materials showed minimal EOT penalty over the temperature range (less than or equal to +0.3 Å relative to the metal gate stack comprising the comparative TiN). The effective work function (eWF) for these Grain size and density increased with increasing temperature. Advantageously, films of high purity were formed. For example, the Nb:N atomic ratios at varying temperatures were consistently approximately 1.1. Impurities due to precursors decreased with increasing temperature. In the intrinsic work function experiments, there was an oxidized surface of $SiO_2$ of a Si substrate, on which there was a high-κ metal oxide layer of $HfO_2$ followed by the work function material, onto which a layer of TiN was deposited by PVD.

Advantageously, deposition of NbN by ALD was a linear process with stable and uniform growth on varying substrates, including TiN, $HfO_2$, and bare Si. Also advantageously, step coverage on a silicon dioxide surface is greater than or equal to 95%.

One or more embodiments of the present disclosure provide devices and methods of formation that are particularly useful in forming positive metal oxide semiconductor (PMOS) integrated-circuit devices and will be described in that context. Other devices and applications are also within the scope of the invention.

FIG. 1 illustrates a cross sectional view of a PMOS metal gate stack device 100. Device 100 comprises a substrate 110. In some embodiments, the substrate 110 comprises silicon. In some embodiments, the surface of substrate 110 is oxidized to form an oxide layer 115 on the substrate 110. In some embodiments, the substrate comprises additional electric elements and materials including but not limited to source regions, drain regions, conductive channels, and other electrical connectors.

According to one or more embodiments, the PMOS metal gate stack device 100 comprises a gate dielectric 120 and a metal gate work function layer 140. As used herein, the metal gate work function layer 140 may also be referred to as a "PMOS work function material". In this configuration, there is not a separate high-κ capping layer because the metal gate work function layer can provide the same functionality.

Gate dielectric 120 electrically insulates the metal gate work function layer 140 from the substrate 110. The gate dielectric 120 and metal gate work function layer 140 together may be referred to herein as a metal gate stack. In some embodiments, the metal gate stack further comprises a gate electrode 150 on the metal gate work function layer 140.

In some embodiments, the gate dielectric 120 comprises a metal oxide. In some embodiments, the gate dielectric 120 is referred to as a high-κ metal oxide layer. In some embodiments, the gate dielectric 120 comprises $HfO_2$.

The PMOS work function material 140 comprises NbN. The inventors have surprisingly found that the use of NbN as a PMOS work function material provides greater PMOS bandedge performance than TiN. In some embodiments, the PMOS work function material excludes transition metal niobium nitride materials, such as titanium-niobium nitride and tantalum-niobium nitride.

The PMOS work function material 140 may have any suitable thickness. In some embodiments, the thickness of the PMOS work function material 140 is in a range of greater than or equal to 5 Å to less than or equal to 50 Å. In some embodiments, the thickness of the metal gate work function is about 15 Å, which includes 15 Å±10%, 15 Å±5%, and/or 15 Å±1%.

In some embodiments, the metal gate stack device 100 further comprises a gate electrode 150. The gate electrode 150 may comprise multiple layers. In some embodiments, the gate electrode 150 comprises a first layer comprising TiAl and a second layer comprising TiN. In some embodiments, the first layer has a thickness of greater than or equal to 20 Å to less than or equal to 30 Å. In some embodiments, the first layer has a thickness of about 25 Å, which includes 25 Å±10%. In some embodiments, the second layer has a thickness of about 500 Å, which includes 500 Å±10%, 500 Å±5%, and/or 500 Å±1%. The first layer and the second layer may be deposited by any suitable method.

Figure 2:
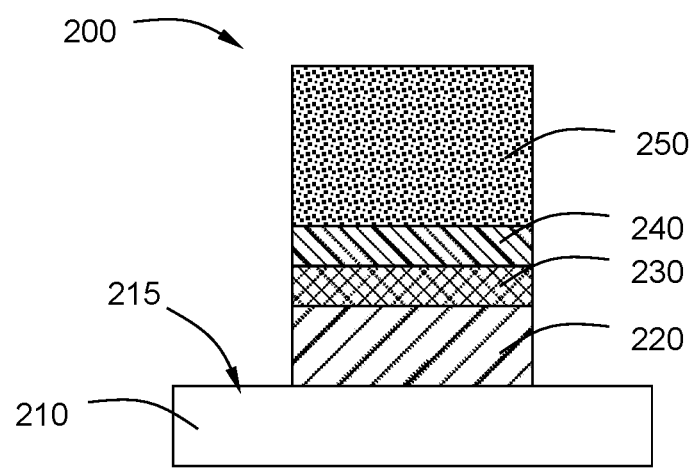
FIG. 2 is a cross-sectional view of a metal gate stack in accordance with one or more embodiments of the disclosure.

FIG. 2 illustrates a cross sectional view of a PMOS metal gate stack device 200 comprising: a substrate 210, a gate dielectric 220, a high-κ capping layer 230, and a metal gate work function layer 240. A gate electrode 250 is optionally included in the gate stack. The metal gate work function layer 240 has the same features as the metal gate work function layer 140 of FIG. 1. The gate dielectric 220 has the same features as the gate dielectric 120 of FIG. 1. The gate electrode 250, when present, has the same features as the gate electrode 150 of FIG. 1.

In some embodiments, the substrate 210 comprises silicon. In some embodiments, the surface of substrate 210 is oxidized to form an oxide layer 215 on the substrate 210. In some embodiments, the substrate comprises additional electric elements and materials including but not limited to source regions, drain regions, conductive channels, and other electrical connectors.

In some embodiments, the high-κ capping layer 230 comprises or consists essentially of TiN. In some embodiments, the high-κ capping layer comprises or consists essentially of TiSiN. As used in this regard, "consists essentially of" means that the stated elements compose greater than 95%, greater than 98%, greater than 99% or greater than 99.5% of the stated material on an atomic basis. For the avoidance of doubt, no stoichiometric ratios are implied by the identification of materials disclosed herein. For example, a TiN material contains titanium and nitrogen. These elements may or may not be present at a 1:1 ratio.

The high-κ capping layer 230 may have any suitable thickness. In some embodiments, the thickness of the high-κ capping layer 130 is in a range of greater than or equal to 5 Å to less than or equal to 25 Å. In some embodiments, the thickness of the high-κ capping layer is about 10 Å, which includes 10 Å±10%, 10 Å±5%, and/or 10 Å±1%.

In some embodiments, the high-κ capping layer 230 comprises TiN.

Flat band voltage ($V_{fb}$) provides a measure of the PMOS work function of a given material with a metal gate stack. The inventors have found that replacing a PMOS work function material 140 or 240 comprising TiN with NbN provides increased $V_{fb}$. When the gate dielectric 120 or 220 comprises $HfO_2$, $V_{fb}$ from a static work function perspective increases by greater than or equal to +100 mV, greater than or equal to +150 mV, greater than or equal to +200 mV, greater than or equal to +225 mV, greater than or equal to +250 mV, greater than or equal to +275 mV. In some embodiments, $V_{fb}$ increases by about +250 mV, which includes +225 mV±10%.

Equivalent oxide thickness (EOT) provides a characteristic of the metal gate stack. In one or more embodiments, a metal gate stack comprising the NbN as a work function material has an EO that is less than or equal to +0.3 Å relative to a comparative metal gate stack comprising comparative TiN as a work function material.

In one or more embodiments, the PMOS work function material comprising NbN has an effective work function of greater than or equal to 4.75 eV.

Figure 3:
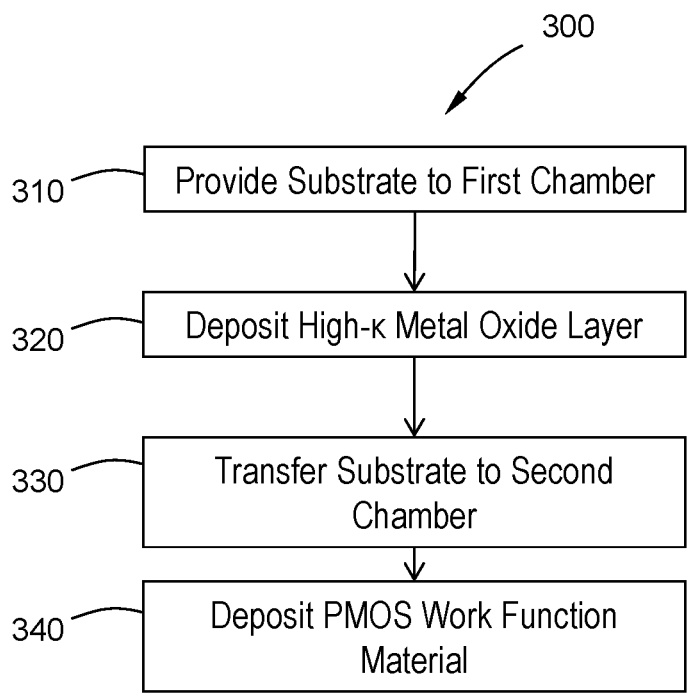
FIG. 3 is a flowchart of a method for forming a metal gate stack according to FIG. 1 in accordance with one or more embodiments of the disclosure.

Referring to FIG. 3, another embodiment of the disclosure relates to a method 300 of forming metal gate stack device 100. The method 300 starts at 310 by providing a substrate within a first processing chamber. At 320, a high-κ metal oxide is deposited on the substrate.

After deposition of the high-κ metal oxide, the substrate is transferred to a second processing chamber at 330. In some embodiments, the first processing chamber and the second processing chamber are integrated. In some embodiments, the method 300 is performed without breaking vacuum or without exposure to ambient air. At 340, a PMOS work function material comprising NbN is deposited by atomic layer deposition on the high-κ metal oxide layer.

In general, any suitable niobium precursor can be used. Thus, niobium precursors can include, but are not limited to $NbCl_5$, $NbB_5$, $NbBr_5$, $NbI_5$, $NbF_5$. Additionally, any suitable nitrogen source precursor can be used. Examples include, but are not limited to, nitrogen gas, ammonia gas, $N_2H_2$ or $N_2H_4$.

Figure 4:
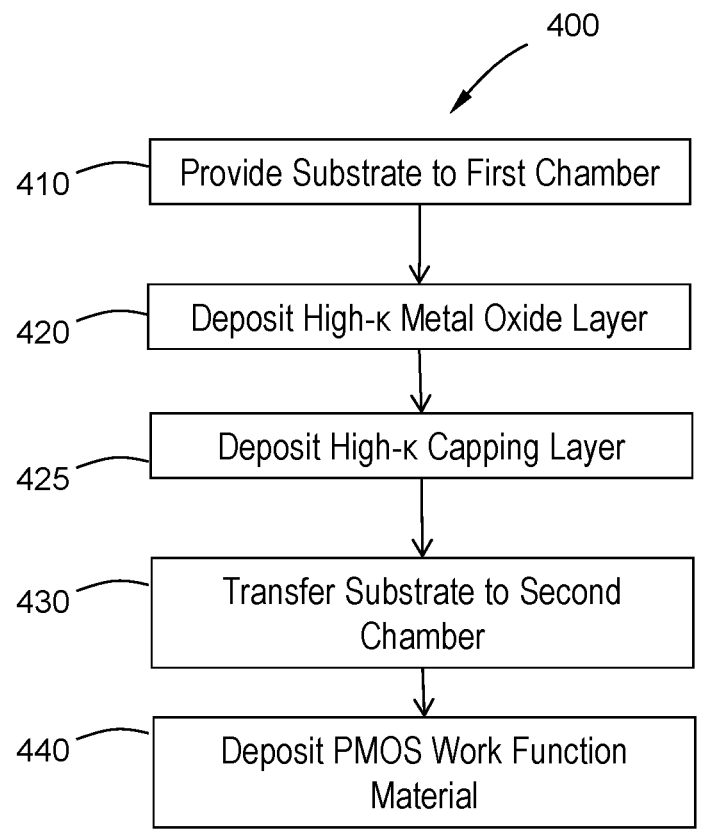
FIG. 4 is a flowchart of a method for forming a metal gate stack according to FIG. 2 in accordance with one or more embodiments of the disclosure.

Referring to FIG. 4, another embodiment of the disclosure relates to a method 400 of forming metal gate stack device 200. The method 400 starts at 410 by providing a substrate within a first processing chamber. At 420, a high-κ metal oxide is deposited on the substrate. At 425, a high-κ capping layer comprising, for example, TiN is deposited on the high-κ metal oxide layer by atomic layer deposition.

For the atomic layer deposition process referred to at 425, an exemplary process for depositing TiN includes: exposing the substrate to a first precursor comprising Ti, and then to a second precursor comprising a nitrogen source to provide a TiN film. In some embodiments, the substrate is exposed to the precursors repeatedly to obtain a predetermined film thickness. In some embodiments, the substrate is maintained a temperature of about 200° C. to about 700° C. during deposition.

Many precursors are within the scope of the invention. Precursors may be a plasma, gas, liquid or solid at ambient temperature and pressure. However, within the ALD chamber, precursors are volatilized. Organometallic compounds or complexes include any chemical containing a metal and at least one organic group, such as alkyls, alkoxyls, alkylamidos and anilides. Precursors can be comprised of organometallic and inorganic/halide compounds.

In general, any suitable titanium precursor can be used for the high-κ capping layer. Thus, titanium precursors can include, but are not limited to $TiCl_4$, $TiBr_4$, $TiI_4$, $TiF_4$, tetrakisdimethylamino titanium. Additionally, any suitable nitrogen source precursor can be used. Examples include, but are not limited to, nitrogen gas, ammonia gas, $N_2H_2$ or $N_2H_4$.

The order in which the substrate is exposed to the precursors can be varied. The exposures may repeat in a deposition cycle. Further, exposure to a precursor may be repeated within a single deposition cycle.

After deposition of the high-κ capping layer, the substrate is transferred to a second processing chamber at 430. In some embodiments, the first processing chamber and the second processing chamber are integrated. In some embodiments, the method 400 is performed without breaking vacuum or without exposure to ambient air. At 440, a PMOS work function material comprising NbN is deposited by atomic layer deposition on the high-κ capping layer in the same way as discussed for 340 of FIG. 3.

Methods of this disclosure can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, a suitable processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, anneal, orientation, hydroxylation and other substrate processes. By carrying out processes in a chamber on a cluster tool, surface contamination of the substrate with atmospheric impurities can be avoided without oxidation prior to depositing a subsequent film.

In some embodiments, the first processing chamber and the second processing chamber are part of the same, clustered, processing tool. Accordingly, in some embodiments, the method is an in-situ integrated method.

In some embodiments, the first processing chamber and the second processing chamber are different processing tools. Accordingly, in some embodiments, the method is an ex-situ integrated method.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, and/or cleaning processes throughout the carousel path.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate is moved relative to the gas distribution plate, or vice-versa.

In embodiments, where one or more of the parts of the methods takes place in one chamber, the process may be a spatial ALD process. Although one or more of the chemistries described above may not be compatible (i.e., result in reaction other than on the substrate surface and/or deposit on the chamber), spatial separation ensures that the reagents are not exposed to each in the gas phase. For example, temporal ALD involves the purging the deposition chamber. However, in practice it is sometimes not possible to purge the excess reagent out of the chamber before flowing in additional regent. Therefore, any leftover reagent in the chamber may react. With spatial separation, excess reagent does not need to be purged, and cross-contamination is limited. Furthermore, a lot of time can be used to purge a chamber, and therefore throughput can be increased by eliminating the purge step.

Figure 5:
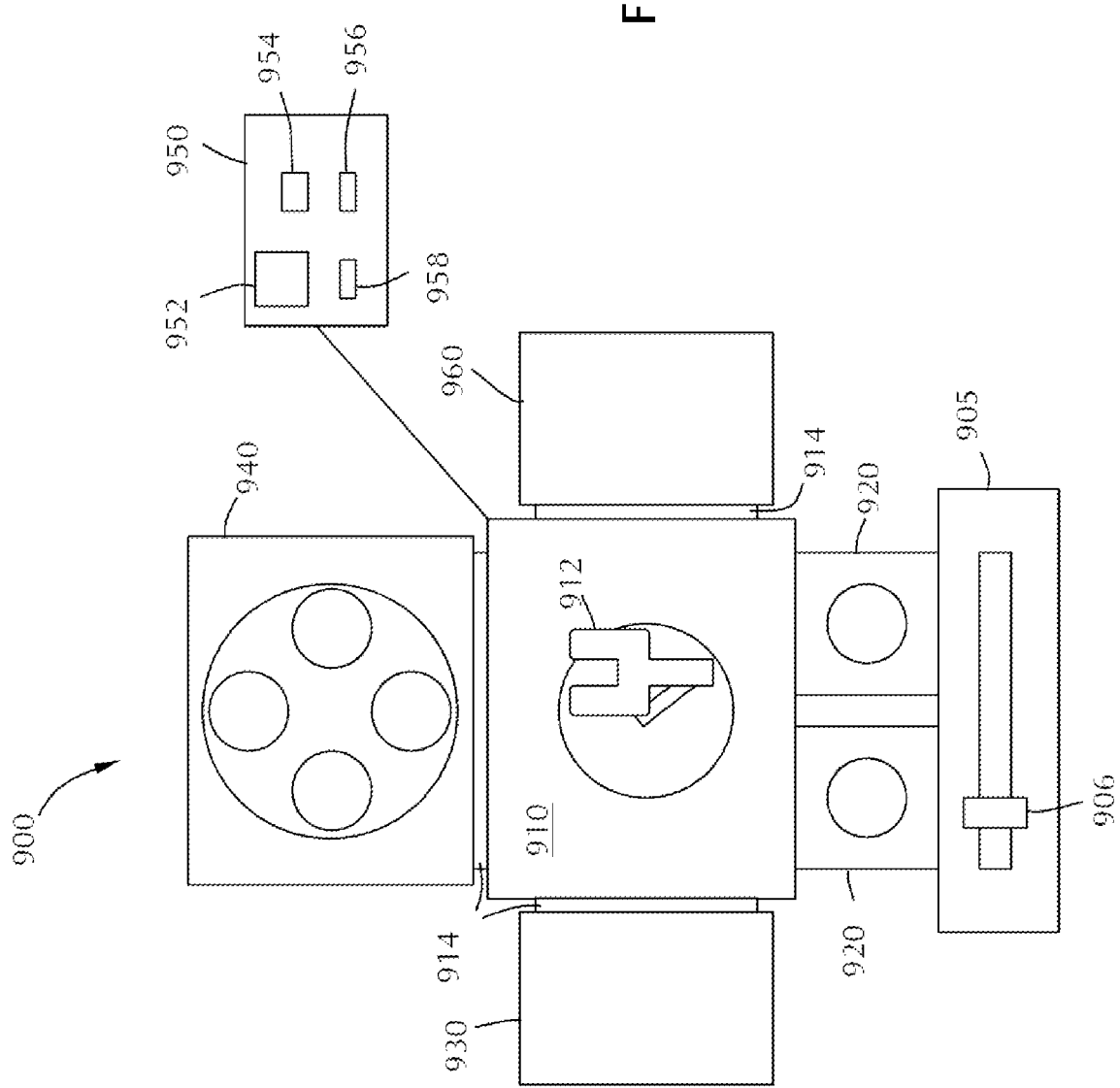
FIG. 5 is a cluster tool accordance with one or more embodiments of the disclosure.

With reference to FIG. 5, additional embodiments of the disclosure are directed to a processing system 900 for executing the methods described herein. FIG. 5 illustrates a system 900 that can be used to process a substrate according to one or more embodiment of the disclosure. The system 900 can be referred to as a cluster tool. The system 900 includes a central transfer station 910 with a robot 912 therein. The robot 912 is illustrated as a single blade robot; however, those skilled in the art will recognize that other robot 912 configurations are within the scope of the disclosure. The robot 912 is configured to move one or more substrate between chambers connected to the central transfer station 910.

At least one pre-clean/buffer chamber 920 is connected to the central transfer station 910. The pre-clean/buffer chamber 920 can include one or more of a heater, a radical source or plasma source. The pre-clean/buffer chamber 920 can be used as a holding area for an individual semiconductor substrate or for a cassette of wafers for processing. The pre-clean/buffer chamber 920 can perform pre-cleaning processes or can pre-heat the substrate for processing or can simply be a staging area for the process sequence. In some embodiments, there are two pre-clean/buffer chambers 920 connected to the central transfer station 910.

In the embodiment shown in FIG. 5, the pre-clean chambers 920 can act as pass through chambers between the factory interface 905 and the central transfer station 910. The factory interface 905 can include one or more robot 906 to move substrate from a cassette to the pre-clean/buffer chamber 920. The robot 912 can then move the substrate from the pre-clean/buffer chamber 920 to other chambers within the system 900.

A first processing chamber 930 can be connected to the central transfer station 910. The first processing chamber 930 can be configured as an atomic layer deposition chamber for depositing a high-κ capping layer and may be in fluid communication with one or more reactive gas sources to provide one or more flows of reactive gases to the first processing chamber 930. The substrate can be moved to and from the processing chamber 930 by the robot 912 passing through isolation valve 914.

Processing chamber 940 can also be connected to the central transfer station 910. In some embodiments, processing chamber 940 comprises an atomic layer deposition chamber for depositing a PMOS work function material and is in fluid communication with one or more reactive gas sources to provide flows of reactive gas to the processing chamber 940. The substrate can be moved to and from the processing chamber 940 by robot 912 passing through isolation valve 914.

In some embodiments, processing chamber 960 is connected to the central transfer station 910 and is configured to act as a gate electrode deposition chamber. The processing chamber 960 can be configured to perform one or more different epitaxial growth processes.

In some embodiments, each of the processing chambers 930, 940, and 960 are configured to perform different portions of the processing method. For example, processing chamber 930 may be configured to perform the high-κ capping layer deposition process, processing chamber 940 may be configured to perform the PMOS work function material deposition process, and processing chamber 960 may be configured to perform a gate electrode deposition process. The skilled artisan will recognize that the number and arrangement of individual processing chamber on the tool can be varied and that the embodiment illustrated in FIG. 5 is merely representative of one possible configuration.

In some embodiments, the processing system 900 includes one or more metrology stations. For example metrology stations can be located within pre-clean/buffer chamber 920, within the central transfer station 910 or within any of the individual processing chambers. The metrology station can be any position within the system 900 that allows the distance of the recess to be measured without exposing the substrate to an oxidizing environment.

At least one controller 950 is coupled to one or more of the central transfer station 910, the pre-clean/buffer chamber 920, processing chambers 930, 940, or 960. In some embodiments, there are more than one controller 950 connected to the individual chambers or stations and a primary control processor is coupled to each of the separate processors to control the system 900. The controller 950 may be one of any form of general-purpose computer processor, microcontroller, microprocessor, etc., that can be used in an industrial setting for controlling various chambers and sub-processors.

The at least one controller 950 can have a processor 952, a memory 954 coupled to the processor 952, input/output devices 956 coupled to the processor 952, and support circuits 958 to communication between the different electronic components. The memory 954 can include one or more of transitory memory (e.g., random access memory) and non-transitory memory (e.g., storage).

The memory 954, or computer-readable medium, of the processor may be one or more of readily available memory such as random access memory (RAM), read-only memory (ROM), floppy disk, hard disk, or any other form of digital storage, local or remote. The memory 954 can retain an instruction set that is operable by the processor 952 to control parameters and components of the system 900. The support circuits 958 are coupled to the processor 952 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 950 has one or more configurations to execute individual processes or sub-processes to perform the method. The controller 950 can be connected to and configured to operate intermediate components to perform the functions of the methods. For example, the controller 950 can be connected to and configured to control one or more of gas valves, actuators, motors, slit valves, vacuum control, etc.

The controller 950 of some embodiments has one or more configurations selected from: a configuration to move a substrate on the robot between the plurality of processing chambers and metrology station; a configuration to load and/or unload substrates from the system; a configuration to deposit a high-κ capping layer comprising TiN or TiSiN; a configuration to deposit a PMOS work function material comprising MoN; and/or a configuration to deposit a gate electrode.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of manufacturing a metal gate stack, the method comprising:
   depositing a high-K metal oxide layer on a substrate within a first processing chamber;
   transferring the substrate to a second processing chamber;
   depositing by atomic layer deposition a positive metal-oxide-semiconductor (PMOS) work function material consisting essentially of NbN on the high-κ metal oxide layer, the positive metal-oxide-semiconductor (PMOS) work function material having a thickness in a range of greater than or equal to 5 Å to less than or equal to 50 Å; and depositing a gate electrode on the positive metal-oxide-semiconductor (PMOS) work function material.

2. The method of claim 1, wherein the PMOS work function material excludes transition metal niobium nitride materials.

3. The method of claim 1, wherein the high-K metal oxide layer comprises $HfO_2$.

4. The method of claim 1, further comprising depositing a high-κ capping layer on the high-κ metal oxide layer prior to depositing the positive metal-oxide-semiconductor (PMOS) work function material.

5. The method of claim 4, wherein the high-κ capping layer comprises TiN.

6. The method of claim 1, further comprising oxidizing a surface of the substrate before depositing the high-κ metal oxide layer on the substrate.

7. The method of claim 1, wherein the gate electrode comprises a first layer comprising TiAl and a second layer comprising TiN.

8. The method of claim 1, wherein depositing the PMOS work function material by atomic layer deposition occurs at a substrate temperature in a range of 300° C. to 500° C.

9. The method of claim 1, wherein the first processing chamber and the second processing chamber are part of the same processing tool.

10. The method of claim 1, wherein the first processing chamber and the second processing chamber are different processing tools.

11. The method of claim 1, wherein the metal gate stack has a flatband voltage (Vfb) improved relative to a metal gate stack comprising a comparative PMOS work function material comprising TiN.

12. The method of claim 11, wherein the Vfb is improved by greater than or equal to +100 mV to less than or equal to +300 mV.

13. The method of claim 11, wherein an equivalent oxide thickness (EOT) increase of the metal gate stack comprising the NbN is less than or equal to +0.3 Å relative to the metal gate stack comprising the comparative TiN.

\* \* \* \* \*